US007000621B1

(12) United States Patent
Verhaverbeke

(10) Patent No.: US 7,000,621 B1
(45) Date of Patent: Feb. 21, 2006

(54) METHODS AND APPARATUSES FOR DRYING WAFER

(75) Inventor: Steven Verhaverbeke, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/009,267

(22) Filed: Dec. 10, 2004

Related U.S. Application Data

(62) Division of application No. 10/097,853, filed on Mar. 12, 2002, now Pat. No. 6,843,855.

(51) Int. Cl.
*B08B 3/00* (2006.01)
(52) U.S. Cl. .................. 134/64 R; 134/68; 134/122 R; 134/148; 134/153; 134/184; 134/902
(58) Field of Classification Search .............. 134/64 R, 134/68, 122 R, 148, 153, 184, 902
See application file for complete search history.

(56) References Cited

U.S. PATENT DOCUMENTS 6,007,675 A 12/1999 Toshima

| | | |
|---|---|---|
| 6,641,678 B1 | 11/2003 | DeYoung et al. |
| 6,748,960 B1 * | 6/2004 | Biberger et al. ............... 134/61 |
| 2003/0045131 A1 * | 3/2003 | Verbeke et al. ............. 438/795 |
| 2004/0248329 A1 * | 12/2004 | Satake et al. ................. 438/16 |

OTHER PUBLICATIONS

Bok, E., et al., "Supercritical Fluids For Single Wafer Cleaning," Solid State Technology, Technology Topics, Jun. 1992, pp. 117-120.

* cited by examiner

*Primary Examiner*—Zeinab El-Arini
(74) *Attorney, Agent, or Firm*—Blakely, Sokoloff, Taylor & Zafman

(57) ABSTRACT

Apparatuses and methods of processing a substrate. The apparatus includes a wet-cleaning chamber, a drying chamber, and a substrate transferring chamber which transfers a substrate to and from the wet-cleaning chamber and the drying chamber. The drying chamber is one of a supercritical drying chamber or a low pressure drying chamber. The wet-cleaning chamber is one of a single-wafer cleaning chamber, a horizontal spinning chamber, a megasonic wet-cleaning chamber, or a horizontal spinning chamber having acoustic waves transmitted to the substrate.

30 Claims, 17 Drawing Sheets

METHODS AND APPARATUSES FOR DRYING WAFER

RELATED APPLICATIONS

This is a divisional of U.S. patent application Ser. No. 10/097,853, now U.S. Pat. No. 6,843,855, filed on Mar. 12, 2002.

BACKGROUND OF THE INVENTION

1. Field of the Invention

The present invention relates to the field of cleaning a substrate and more particularly to apparatuses and methods for cleaning voids or pores inside a substrate.

2. Discussion of Related Art

Integrated circuits generally are formed by interconnecting devices such as transistors, capacitors, and resistors together with metal lines. The metal lines are typically isolated from each other with dielectric layers. These dielectric layers are sometimes referred to as intermetal dielectric or interlayer dielectrics (ILD). A preferred intermetal dielectric is silicon dioxide ($SiO_2$) which has a dielectric constant of about 4.

The capacitance between two metal layers is given by:

$$C = \frac{\varepsilon_r \cdot \varepsilon_0 \cdot A}{d}$$

wherein d is the distance between the metal layers. The $\epsilon_r$ value is called a relative dielectric constant (relative to vacuum) or a relative permittivity of a particular dielectric material. The relative permittivity is also called the K value of the dielectric material.

With faster and faster clock frequencies (current microprocessors are made in the MHz and GHz range), the effect of the capacitance between two metal lines becomes more and more important. On top of that the capacitance increases because the distance between two metal lines, d, becomes smaller and smaller with more and more device scaling (e.g., miniaturization). The only way to decrease C is to decrease $\epsilon_r$, but since this is a material property, this can only be done by changing the intermetal insulating material. As mentioned above, the conventional intermetal insulating material SiO2 has an $\epsilon_r$ value of roughly 4. The lowest $\epsilon_r$ value possible is the value of vacuum, which is 1. Therefore, different intermetal insulating materials are being introduced which have $\epsilon_r$ values less than 4. A dielectric material having an $\epsilon_r$ value less than 4 is referred to as low-K material. It is known that air is the best dielectric material but air alone is insufficient to provide the mechanical structure for the electronic devices. FIG. 1 illustrate an exemplary dielectric material 101 having voids or pores 103 to give the low $\epsilon_r$ value.

Many of the "low-K" materials thus rely on the inclusion of voids or pores to achieve this lowered $\epsilon_r$ value. Materials with a high degree of voids, or otherwise said porous materials, can have dielectric constant values as low as 2, or half of $SiO_2$.

FIG. 2A illustrates that traditionally, an ILD layer 204 is blanket deposited over a substrate 202 which can be a silicon wafer. Next, a photoresist layer 206 is spun on top of the ILD layer 204 as shown in FIG. 2B. The photoresist layer 206 is then exposed and developed using a patterned mask and UV light as shown in FIG. 2C. Then, a dry dielectric plasma etch is used to etch a pattern in the ILD layer 204 in alignment with the photoresist layer 206 as shown in FIG. 2D. The photoresist layer 206 can be removed with some a dry technique such as a direct plasma strip or a remote plasma strip well practiced in the art. When the photoresist layer 206 is removed, the substrate 202 is left with the ILD layer 204 as shown in FIG. 2E.

After the removal of the photoresist, residues remain on the wafer as well as in the etched features in the intermetallic layer dielectric. These residues must be cleaned before the next step can occur. Most current cleaning techniques for such residues rely on a liquid spraying or immersion step that cleans those residues away. These liquids can be either solvents or aqueous based. When using a liquid to clean residues of a porous material that is being used as a low-K material, the liquid will clean off the residues, but the liquid, because of the capillary force, will be drawn into the pores and voids of the low-K material. FIG. 3 illustrates an example of that a low-k layer 101 formed on a substrate 100 could have liquids trapped within the pores or voids 103. The liquids that are trapped can be water, reagent, or any other rinsing or cleaning liquids that are used to clean the substrate 100 during the making of various electronic devices on the substrate 100.

It is thus advantageous to have methods and apparatuses that can clean low-K materials and that remove liquids from the pores and voids in a cleaned low-K material.

SUMMARY OF THE INVENTION

Methods and apparatuses are disclosed for cleaning a substrate that has voids and pores. An exemplary apparatus comprises a wet-cleaning chamber, a supercritical drying chamber, and a substrate transferring chamber which transfers a substrate to and from the wet-cleaning chamber and the supercritical drying chamber. The substrate is cleaned and dried in the wet-cleaning chamber to remove any visible residues and liquids. The substrate is further dried in the supercritical drying chamber, which uses a supercritical fluid to remove residual liquids from the voids and pores in the substrate.

Another exemplary apparatus comprises a wet-cleaning chamber, a low-pressure chamber, and a substrate transferring chamber which transfers a substrate to and from the wet-cleaning chamber and the lower pressure chamber. The substrate is cleaned and dried in the wet-cleaning chamber to remove any visible residues and liquids. The substrate is further dried in the low-pressure chamber, which uses an operating pressure less than 10 Torrs and an operating temperature ranging from about 100° C. to 200° C. to remove residual liquids from the voids and pores in the substrate.

A pressure less than 10 Torr and a temperature ranging from about 100–200° C. are used in the low-pressure chamber to dry the substrate.

In various embodiments of the present invention another example, the wet-cleaning chamber is either a single-wafer cleaning chamber, a megasonic wet-cleaning chamber, a horizontal spinning chamber, or a horizontal spinning chamber having sonic waves transmitted to the substrate.

BRIEF DESCRIPTION OF THE DRAWINGS

The present invention is illustrated by way of example and not limitation in the figures of the accompanying drawings.

DETAILED DESCRIPTION OF THE INVENTION

The present invention covers apparatuses and methods for processing a substrate. In the following description, for purposes of explanation, numerous specific details are set forth in order to provide a thorough understanding of the present invention. It will be evident, however, to one skilled in the art, that the present invention may be practiced without these specific details. In other instances, specific apparatus structures and methods have not been described so as not to obscure the present invention. The following description and drawings are illustrative of the invention and are not to be construed as limiting the invention.

In the present invention, a solvent or an aqueous based cleaner is used on a substrate in a wet-cleaning chamber. Such a substrate includes semiconductor wafers having electronic devices interconnected by metal lines which are insulated from each other by ILD layers formed thereon. The use of the solvent or the aqueous based cleaner on the substrate in the wet-cleaning chamber remove any visible residue left on the substrate after the processes used to form the various layers. The wet-cleaning chamber can be a single-wafer cleaning chamber and/or a horizontal spinning chamber. Additionally, the wet-cleaning chamber can have a megasonic plate wherein an acoustic energy is generated and directed onto the non-device side of the substrate. After wet cleaning the substrate, the substrate is macroscopically dried in the wet-cleaning chamber. Macroscopic drying dries the substrate such that a visual inspection shows that no liquid and residue can be seen on the substrate. Macroscopic drying may leave residual liquids in pores that may be present in the substrate. After the substrate is macroscopically dried, the substrate is transferred to a drying chamber for further drying, referred to as microscopic drying.

Figure 1:
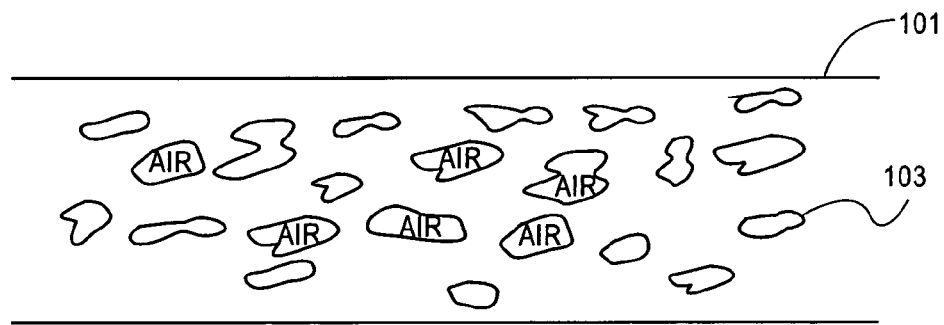
FIG. 1 illustrates an exemplary low-k dielectric material which is porous.
Figure 2A:
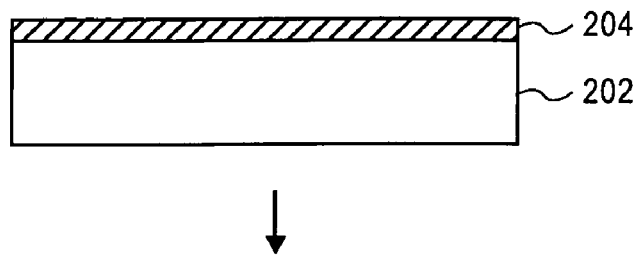
FIGS. 2A to 2E illustrates a conventional process of forming an interlayer dielectric on a substrate such as a wafer.
Figure 2B:
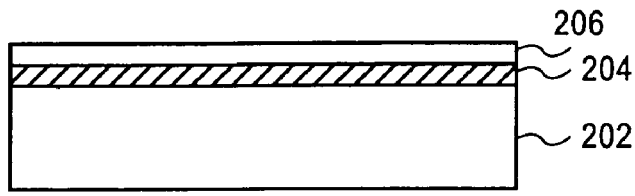
Figure 2C:
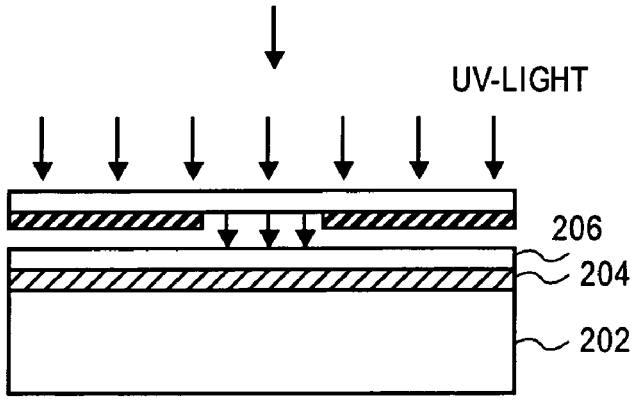
Figure 2D:
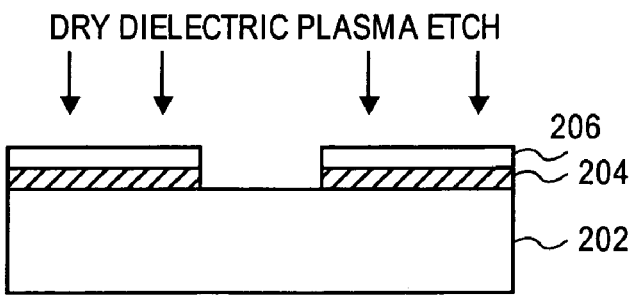
Figure 2E:
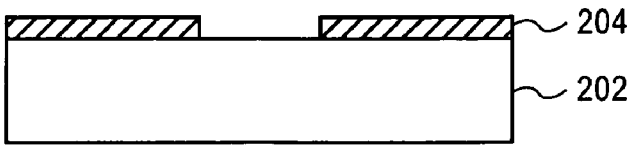
Figure 3:
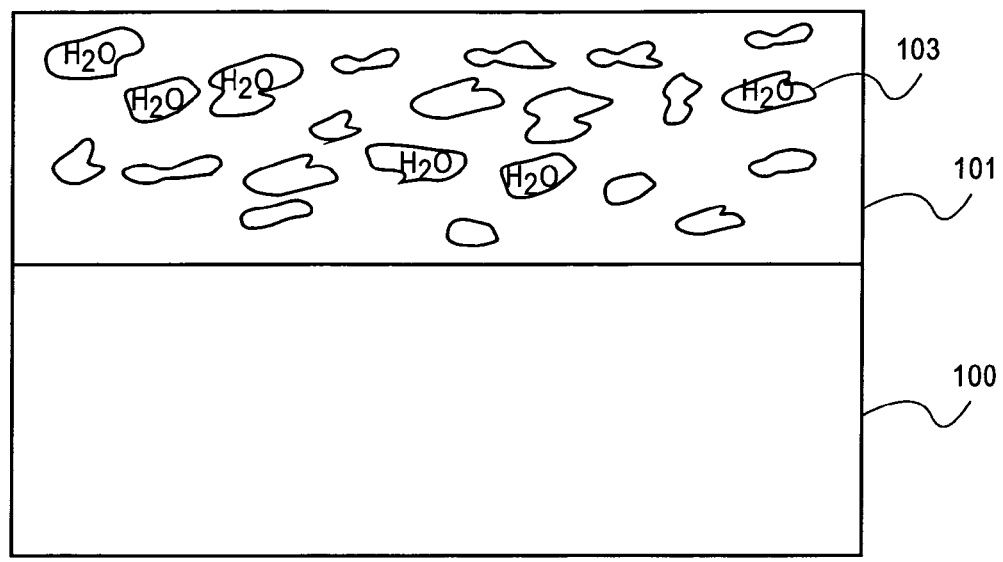
FIG. 3 illustrates that cleaning and drying a substrate having an interlayer dielectric made out of low-k dielectric material may leaves residual liquids trapped in pores or voids present in the interlayer dielectric.
Figure 4:
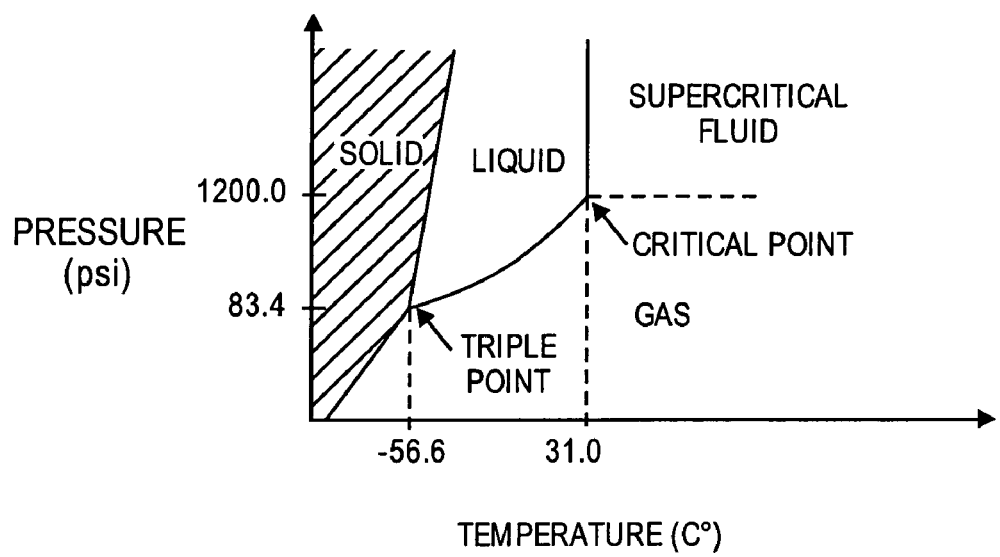
FIG. 4 illustrates an exemplary phase diagram of a drying gas (e.g., $CO_2$) that can be converted into a supercritical fluid under an appropriate condition.

In one example, microscopic drying involves the use of a supercritical fluid. In this example, during a microscopic drying process, a drying gas that is able to transition into a supercritical state under a certain appropriate condition and becomes a supercritical fluid is introduced into the supercritical drying chamber. One example of such a drying gas includes carbon dioxide ($CO_2$). FIG. 4 illustrates that a substance such as $CO_2$ at its supercritical state has no surface tension; its surface tension is that of a gas; and its density properties are those of a liquid. As shown in FIG. 4, $CO_2$ has a critical point at 1200 psi and 31° C. and at this point, $CO_2$ is said to be in its supercritical state, and is called supercritical fluid. One reason attributed to the unique properties of a supercritical fluid such as $CO_2$ is that at the critical temperature (e.g., 31° C. for $CO_2$), condensation cannot occur at any pressure. The region to the right of the critical temperature and above critical pressure (e.g., 1200 psi for $CO_2$) defines the supercritical state of the drying gas such as $CO_2$.

The supercritical fluid quickly penetrates any pore or void in the substrate to remove any liquids trapped in the pores or voids. The pressure of the chamber is then released allowing the supercritical fluid to evaporate bringing with it the liquids that are removed from the voids or pores. The liquids trapped in the pores or voids can be a cleaning reagent, rinsing reagent, or water that is used to clean the substrate during the making of the electronic devices on the substrate. Examples of openings that can be microscopically dried include pores and voids in an insulation layer, pores and voids in a low-K dielectric material, and gaps in the substrate that may trap cleaning fluid.

In another example, the microscopic drying involves the used of a low-pressure and high temperature drying condition. In this example, after the substrate is macroscopically dried as above, the substrate is transferred to a low-pressure chamber for the microscopic drying. The low-pressure chamber is heated up to a temperature ranging from about 100° C. to 200° C. and evacuated to a pressure below 10 Torr. The high temperature and the low pressure cause liquids trapped in the pores or voids in the substrate or in the layers formed on the substrate to evaporate.

An exemplary apparatus of the present invention comprises a wet-cleaning chamber which is coupled to a single-wafer drying chamber adapted for microscopic drying a substrate having a porous film deposited thereon. The microscopic drying occurs after the substrate and the porous film is macroscopically dried in the wet-cleaning chamber. The apparatus also comprises a substrate transferring chamber which transfers the substrate to and from the wet-cleaning chamber and the single-wafer drying chamber. The single wafer drying chamber can be a supercritical drying chamber or a low pressure chamber.

Figure 5:
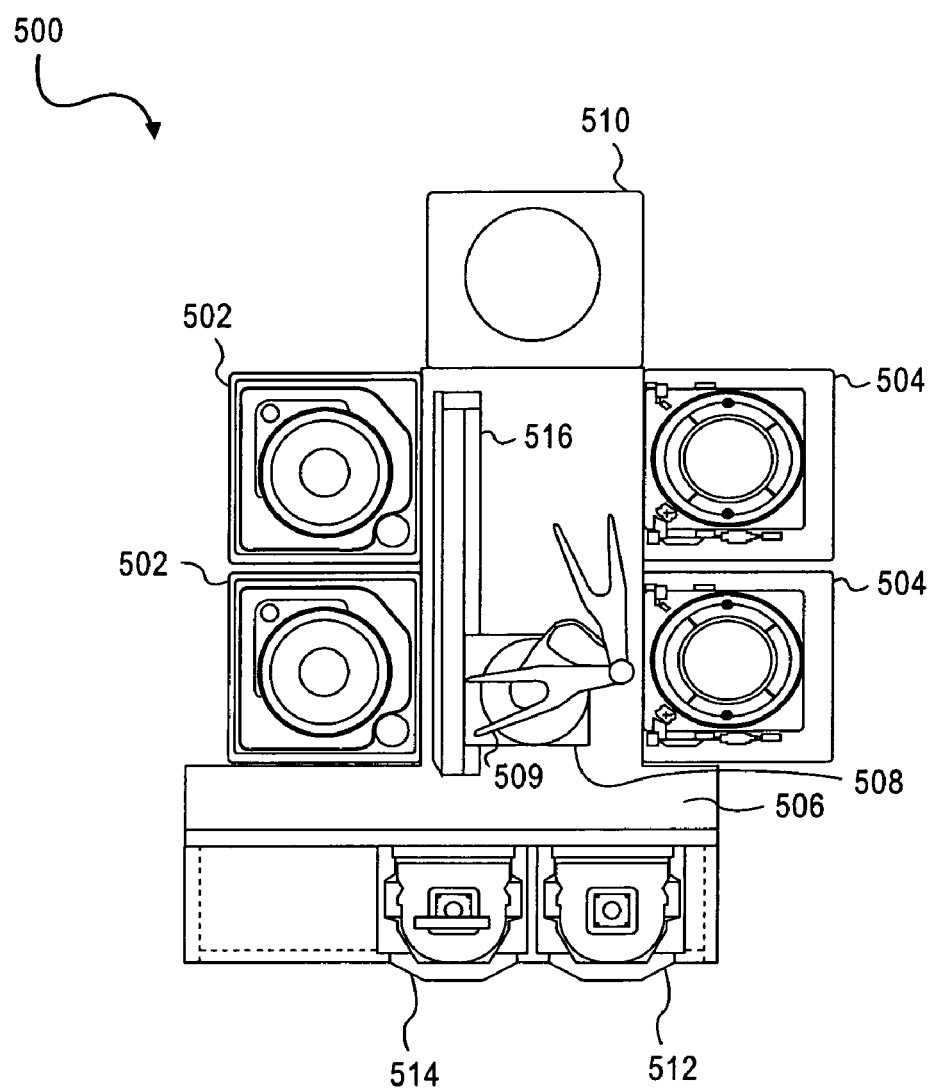
FIG. 5 illustrates an exemplary apparatus that includes a supercritical drying chamber which can be used to dry a substrate in accordance with the present invention.

FIG. 5 illustrates an exemplary embodiment of the present invention. In this embodiment, a wafer processing apparatus 500 comprises a wet-cleaning chamber 502, a supercritical drying chamber 504, and a substrate transferring chamber 506 used for processing a substrate such as a wafer. Processing a substrate may include at least forming electrical devices such as transistors, capacitors, or resistors, interconnected by metal lines which are insulated by interlayer dielectrics upon the wafer, cleaning the wafer, cleaning the films formed on the wafer, drying the wafer, and drying the films formed on the wafer, to name a few. As illustrated in this figure, more than one wet-cleaning chamber 502 and more than one supercritical drying chamber 504 can be included in the apparatus 500 depending on needs or applications. In another example, the apparatus 500 includes an inspection chamber 510 which may include tools (not shown) to inspect the substrates that have been processed in the apparatus 500. The tools may include devices that inspect the wafer to see if all of the liquids are removed from the wafer and the ILD layers.

In one embodiment, the wafer processing apparatus 500 is a cluster including several single wafer processing chambers, for example, the two wet-cleaning chambers 502, the two supercritical drying chambers 504, and the substrate transferring chamber 506. The apparatus 500 can also include film deposition chambers (not shown) such as a chemical vapor deposition chamber and a physical vapor deposition chamber. These chambers are positioned about the robot arm assembly 509. The apparatus 500 also includes a number of wafer cassettes 512 and 514, each holding a plurality of wafers to be cleaned, dried, or that have been cleaned or dried. The apparatus 500 can be placed under a normal atmospheric environment. And, all of the chambers within the apparatus 500 can be placed on a horizontal platform which houses the substrate transferring chamber 506.

In one example, a wafer can be processed first in a film deposition chamber to have a film or films formed upon the wafer surface. The wafer is then moved to the wet-cleaning chamber 502 for macroscopic cleaning to remove all visibly detectable residues or liquids (e.g., particles and reagents). Then, the wafer is moved to the supercritical drying chamber 504 to remove the liquids that are not visibly detectable but that are trapped in the voids or pores of the films formed on the wafer. Removing the liquids that are trapped in the voids or the pores is referred to as microscopic drying as discussed above. The cleaning processes of the wafer in the apparatus 500 proceeds in a sequence timed to optimize the use of available space and the robot arm assembly 509. One possible sequence for cleaning and drying wafers that has film(s) formed upon it includes: the robot arm assembly 509 take an unclean wafer from a wafer cassette 512, install the wafer into a wet-cleaning chamber 502, remove a clean wafer from another wet-cleaning chamber 502, place this clean wafer into a supercritical drying chamber 504, and take a dried wafer from another supercritical drying chamber 504 and place the dried wafer into the wafer cassette 514. This movement from the wafer cassette 512 to one wet-cleaning chamber 502, to a supercritical drying chamber 504, and so on will optimize wafer cleaning times. Other sequence variations may be used to select an optimal wafer cleaning and drying cycle time.

Figure 6:
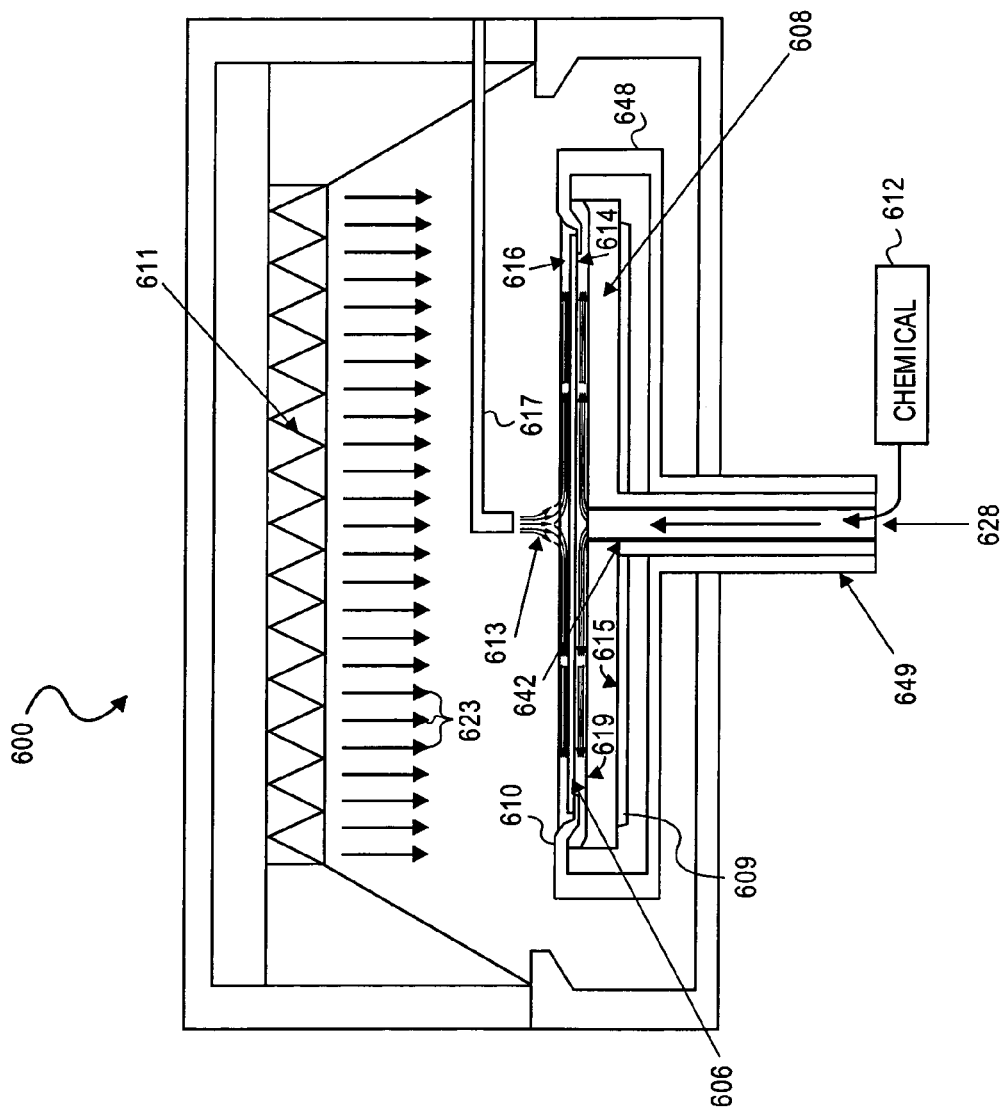
FIGS. 6 and 7 illustrate an exemplary single-wafer cleaning chamber that can be used to clean a substrate, macroscopically dry the substrate, and microscopically dry the substrate according to some exemplary embodiments of the present invention.
Figure 7:
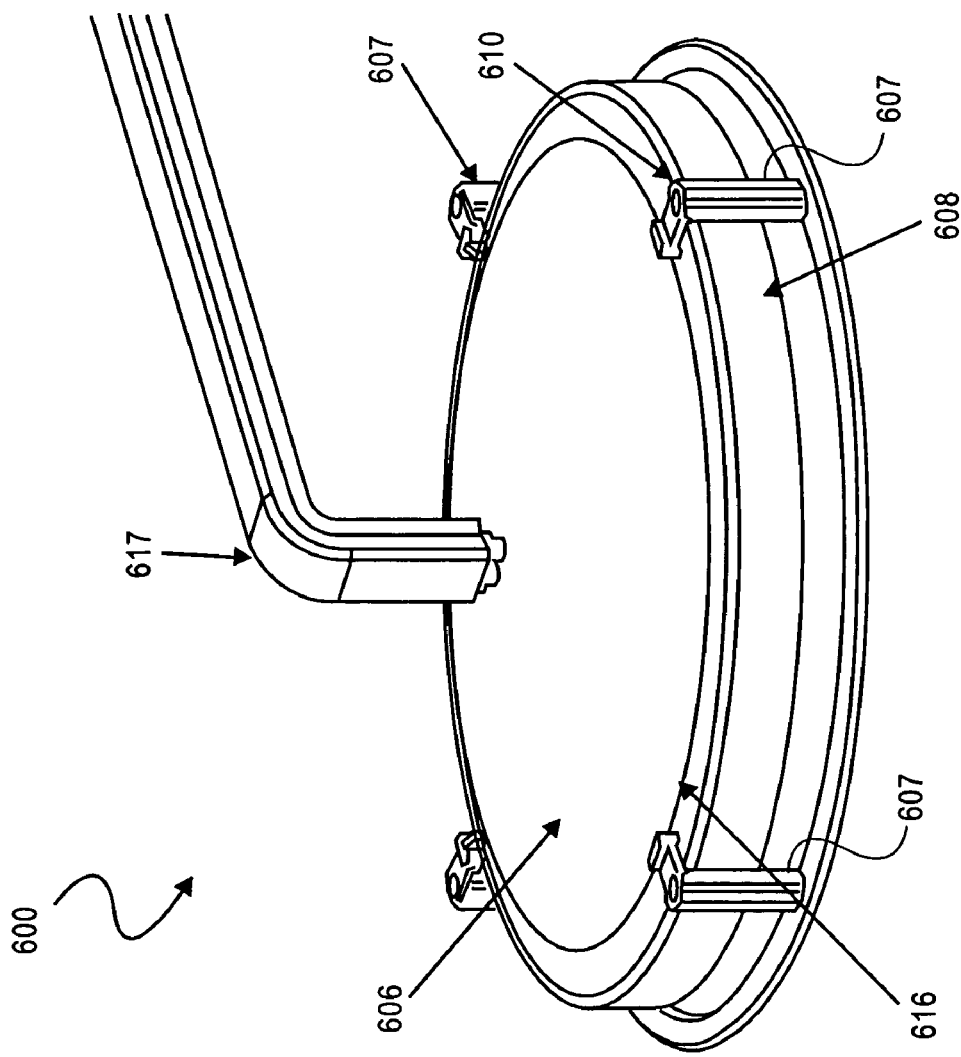

In one example, the wet-cleaning chamber is a single-wafer cleaning chamber as illustrated in FIGS. 6 and 7. FIG. 6 is a cross-sectional illustration of one embodiment of a single-wafer cleaning chamber 600; and FIG. 7 is a three-dimensional illustration of major components of the embodiment illustrated in FIG. 6 for clarity sake. In one example, the bottom side of the wafer 606 (wafer bottom surface 614) is exposed to cleaning, rinsing and drying chemicals 612. The topside of the wafer 606 (wafer top surface 616) is not exposed to any chemicals. The wafer bottom surface 614 (which could be the wafer non-device side) is facing down to be exposed to chemicals 612, while the wafer top surface 616 (which could the device side) is facing up and is not exposed to chemicals 612. In another example, both, the wafer top surface 616 and the wafer bottom surface 614 can be exposed to chemicals.

In another embodiment, the chamber 600 includes rotatable wafer holding bracket (bracket) 648, which translates along an axis of a rotation device 649. The rotation device 649 can further be coupled to an electronic motor (not shown) which can rotate the bracket 648. The chamber 600 also includes an access door (not shown) through which a robot arm (not shown) holding the wafer 606 enters to place the wafer 606 in the bracket 648. In one embodiment, the wafer 606, when positioned in the bracket 648, can rest on support clips 610 and vertical support post 607 (only shown in FIG. 7) included in the bracket 648. The bracket 648 together with the support posts 607 can raise or lower the wafer 606 to a desirable position.

In one embodiment, the bracket 648 can rotate the wafer 606 while chemicals 612 are dispensed from below during a cleaning cycle. In another embodiment, the bracket 648 rotates the wafer 606 while chemicals 612 are dispensed from another nozzle the top and the bottom surface of the wafer 606 during a cleaning cycle. In another embodiment, the bracket rotates the wafer 606 in a horizontal direction during cleaning.

Continuing with FIGS. 6 and 7, in another embodiment, the chamber 600 includes a platter 608. The platter 608 is flat where it faces the wafer 606 and therefore, the distance separating the platter 608 and the wafer 606 is uniform. The gap between the wafer 606 and the platter 608 may be in the range of approximately 1–5 millimeters (mm) and preferably approximately 3 mm. Chamber 600 also includes a tube 628 connected to a through hole (feed port) 642 in the platter 608. During a cleaning cycle, cleaning fluids or chemicals are introduced through the tube 628. As a result of wafer 606 rotation (spin) and chemicals 612 applied to the wafer bottom surface 614. A nozzle located on the top can dispense chemicals to the top surface of the wafer. The residues and/or liquids left on the wafer that needed to be cleaned off are removed as the wafer 606 is rotated at high speed.

In another embodiment, the chamber 600 further includes a filter 611 such as a High Efficiency Particulate Arresting (HEPA) filter or an Ultra Low Penetration Air (ULPA) filter. A downward flow of air 623 from the filter 611 and gravity can act to maintain the wafer 606 positioned on the posts 607.

In another embodiment, the platter 608 of the chamber 600 shown in FIGS. 6 and 7 has a platter top surface 619 and a platter bottom surface 615, with a set of acoustic wave transducers 609 attached to the platter bottom surface 615. The platter top surface 619 can be facing the wafer 606. When the wafer 606 is placed in the bracket 648, the wafer 606 can be centered over and held substantially parallel to the platter 608 to create the gap. The gap distance is approximately 3 mm but can fall within the range of approximately 1–5 mm. In this embodiment, acoustic waves or megasonic sound waves can be emitted from the platter 608 to transfer through cleaning fluids flowing from below and strike the wafer bottom surface 614.

The use of acoustic wave transducers 609 generating frequencies in the megasonic range has recently become common in wafer cleaning. The difference between ultrasonic cleaning and megasonic cleaning lies in the frequency that is used to generate the acoustic waves. Ultrasonic cleaning uses frequencies from approximately between 20–400 kHz and produces random cavitation. Megasonic cleaning uses higher frequencies beginning at between 350400 kHz and may use frequencies well into the MHz range. An important distinction between the two methods is that the higher megasonic frequencies do not cause the violent cavitation effects found with ultrasonic frequencies. Megasonic waves significantly reduce or eliminate cavitation erosion and the likelihood of surface damage to the wafer. In general, the higher the frequency, the lower the damage to the wafer.

Megasonic cleaning produces more controlled cavitation. Cavitation, the formation and activity of bubbles, is believed to be an important mechanism in the actual particle removal process because cavitation has sufficient energy to overcome particle adhesion forces and cause particles to be removed. Controlled cavitation becomes acoustic streaming which can push the particles away so they do not reattach to the wafer. Megasonic cleaning may be improved by varying and/or pulsing the input power to the megasonic transducers, which can provide better control over cavitation than applying power continuously at a constant level. Megasonic cleaning may be improved through the use of a plurality of frequencies to be simultaneously generated, or by changing one or more frequencies during the clean and rinse the cycles, or a combination thereof. Megasonic cleaning may also be improved through a selection of the frequency or frequencies used.

In another embodiment, the chamber 600 above can also include other nozzles (not shown) that allow cleaning fluid to be flown in onto the wafer top surface 616. Thus, a first group of chemicals can be transferred to the wafer bottom surface 614 while chemicals from a different source (a second group of chemicals) can be transferred to a wafer top surface 616. In this embodiment, the megasonic sound waves can be placed within cleaning fluid that are applied to the wafer top surface 616 where the solutions may be in the form of a spray or a thin film.

In another embodiment, the chamber 600 is used to spin dry the wafer 606 after each wet cleaning cycle. For example, after a wet cleaning cycle, the rotating device 649 continues to rotate the bracket 648 thus spinning the wafer 606. The spinning of the wafer 606 removes the liquids (or reagents) that are used to clean the wafer 606. Additionally, isopropanol alcohol (IPA) can also be added through the chemical 612 through the tube 628 to facilitate the rinsing of the wafer 606 (referred to as IPA-assisted rinsing). Spin drying of the wafer 606 macroscopically dries the wafer 606. Macroscopic drying may not remove the liquids that are trapped in the pores or the voids of the ILD layers that are formed on the wafer 606. Microscopic drying is thus necessary.

Figure 8:
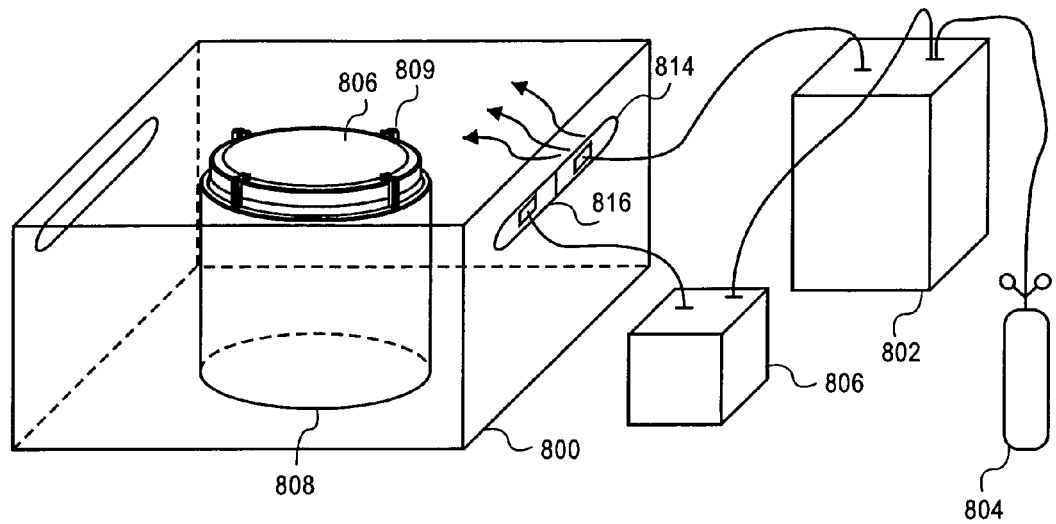
FIG. 8 illustrates an exemplary supercritical drying chamber that can be used to microscopically dry a substrate according to some exemplary embodiments of the present invention.

FIG. 8 illustrates an exemplary embodiment of a supercritical drying chamber 800 which can be the supercritical drying chamber 504 mentioned in FIG. 5. In this example, the supercritical drying chamber 800 is used for drying the wafer 606 after it has been cleaned or rinsed and macroscopically dried in the wet-cleaning chamber 600 discussed above.

In one embodiment, the supercritical drying chamber 800 is made out of stainless steel or other suitable material that enable this chamber to withstand an operating temperature and pressure sufficient to maintain a drying gas in its supercritical state. The drying gas in the supercritical drying chamber 800 is a substance that can transition into a supercritical state under a certain appropriate condition (e.g., pressure and temperature) and become a supercritical fluid. The supercritical fluid used in the supercritical drying chamber 800 is a substance that possesses liquid-like solvating properties and gas-like diffusion and viscosity, which enables the supercritical fluid to rapidly penetrate into voids, pores, gaps, crevices, or openings, and completely remove or dissolve liquids, residues, or contaminants. One example of such a drying gas is $CO_2$. Other supercritical fluids are commercially available, though, $CO_2$ is the most commonly used owing to its inert, non-toxic, non-flammable characteristics and abundant in nature. An appropriate condition to turn $CO_2$ into supercritical fluid $CO_2$ includes a pressure of 1200 psi or greater and a temperature of 31° C. or greater. In one embodiment, the supercritical drying chamber 800 is designed to withstand a pressure higher than 800 psi and a temperature higher than 25° C.

The supercritical drying chamber 800 includes a substrate holder 808 which is designed to hold a substrate such as the wafer 606. The substrate holder 808 can be a solid block placed in the center of the supercritical drying chamber 800. The wafer 606 rests on the substrate holder 808 which may have a non-slippery surface. Alternatively, the substrate holder 808 may also includes a plurality of support clips 809 located along its surface for holding the wafer 606 in place. In one example, the wafer 606 sits immediately above the top surface of the substrate holder 808. In another example, the wafer 606 may be raised slightly above the top surface of the substrate holder 808 and held in place by the support clips 809 such that a small gap is created between the top surface of the substrate holder 808 and the wafer 606.

Figure 10:
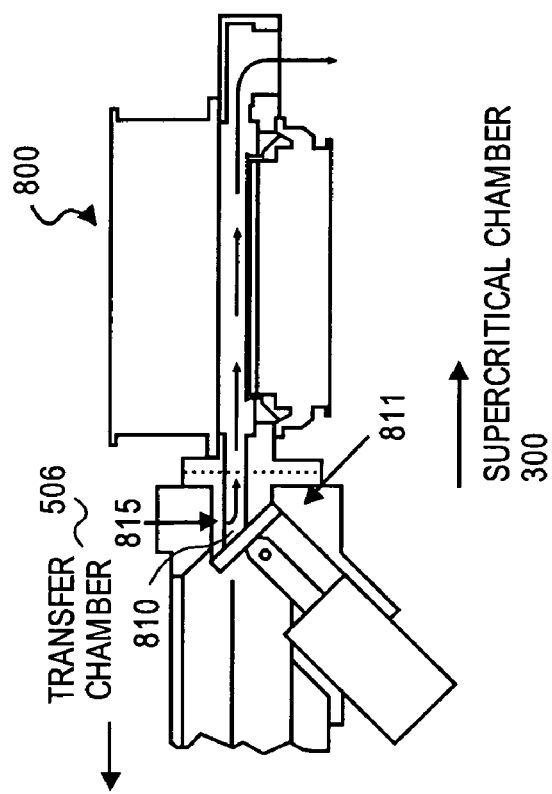
FIG. 10 illustrates an exemplary a slit valve used to close the slit in the supercritical drying chamber after a wafer is loaded.

The supercritical drying chamber 800 further includes a slit 810 through which the wafer 606 can be inserted into the chamber 800. The slit 810 is similar to the access door in the wet-cleaning chamber 502 mentioned above. In one example, the slit 810 has a height slightly larger than the thickness of the wafer 606. In another example, the slit 810 has a height sufficiently large to allow the robotic arm assembly 509 (in FIG. 5) to place the wafer 606 through the slit 810. The slit 810 must be sealed during a drying cycle so that the drying gas can be brought to its supercritical state or be maintained in the supercritical state. In one exemplary embodiment, a slit valve 811 is used to close the slit 810. FIG. 10 illustrates one exemplary embodiment a slit valve 811, which is coupled to the supercritical drying chamber 800. The slit valve 811 is coupled to a device (not shown) that moves the valve over the slit 810 sealing or closing the slit 810 during a drying cycle.

Figure 11:
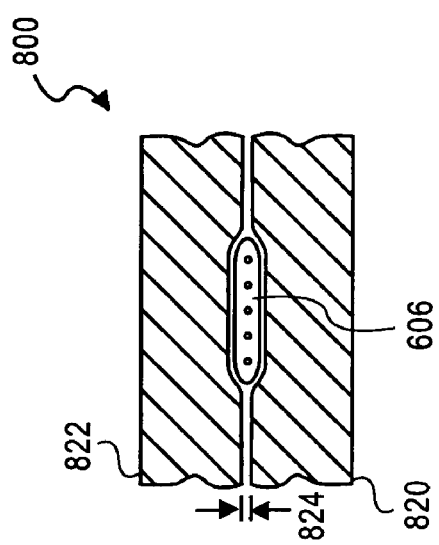
FIG. 11 illustrates yet another exemplary supercritical drying chamber that can be used to microscopically dry a substrate according to some exemplary embodiments of the present invention.

In another embodiment, as shown in FIG. 11, the supercritical drying chamber 800 includes a lower block 820, an upper block 822, and a slit 824. The wafer 606 sits on the lower block 820. The chamber 800 in FIG. 11 includes a hydraulic mechanism (not shown) which raises or lowers the lower block 820. During loading and unloading of the wafer 606, the lower block 820 drops a slightly (e.g., several millimeters or a distance sufficient to allow the wafer 606 to be loaded) to allow for the loading of the wafer 606. Once the wafer 606 is in position, the lower block 820 is raised back up sealing the supercritical drying chamber 800.

The drying gas such as $CO_2$ can be introduced into the supercritical drying chamber 800 in the form of a supercritical fluid. Alternatively, the drying gas can first be introduced into the supercritical drying chamber 800 in a gas form and then be brought up to its supercritical state in the supercritical drying chamber 800.

FIG. 8 illustrates the first option. In one embodiment, the supercritical drying chamber 800 includes an inlet 814 through which the drying gas can be supplied into the supercritical drying chamber 800. The supercritical drying chamber 800 also includes an outlet 816. The outlet 816 is used for cleaning the supercritical drying chamber 800 after each use. For example, the outlet 816 allows the dissolved liquids or the vapors that are pushed out or evaporated out of the voids or pores in the wafer 606 by the supercritical fluid to escape the chamber. In this embodiment, the supercritical drying chamber 800 is coupled to a preparation chamber 802. The preparation chamber 802 is further coupled to a drying gas cylinder 804 that can inject the cleaning as into the preparation chamber 802. In one example, the preparation chamber 802 pressurizes and heats up the drying gas (e.g., $CO_2$) to its supercritical state before injecting it into the supercritical drying chamber 800. In this example, the preparation chamber 802 couples to a conventional gas compressor for pressurizing the $CO_2$. The preparation chamber 802 also couples to a heating element (not shown) that can heat up the $CO_2$ inside the preparation chamber 802. Once the $CO_2$ is transitioned into its supercritical state and becomes a supercritical fluid, the supercritical fluid $CO_2$ can be supplied into the supercritical drying chamber 800.

Figure 9:
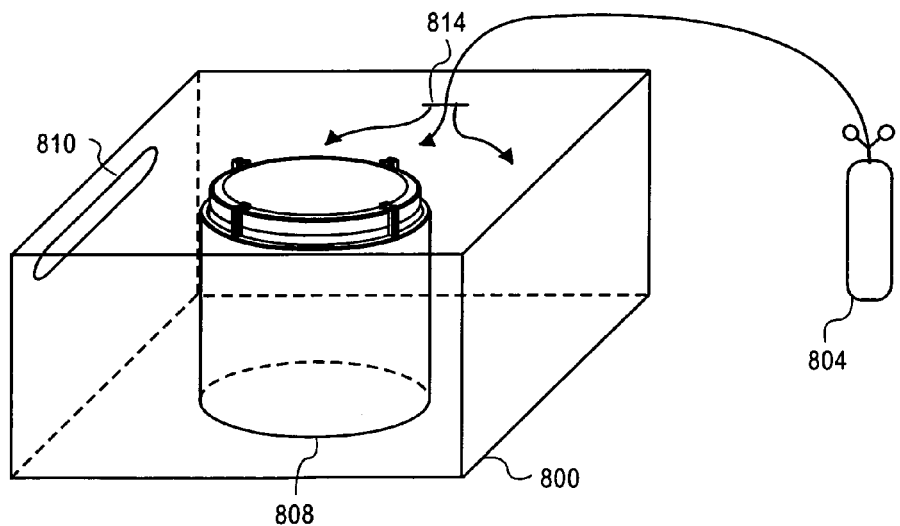
FIG. 9 illustrates another exemplary supercritical drying chamber that can be used to microscopically dry a substrate according to some exemplary embodiments of the present invention.

FIG. 9 illustrates the second option in which the drying gas is brought up to its supercritical state inside the supercritical drying chamber 800. The supercritical drying chamber 800 can be coupled to the gas compressor and the heating element (not shown) such that the drying gas can be brought to its supercritical state within the supercritical drying chamber 800. In this example, the drying gas may be injected into the supercritical drying chamber 800 directly from the supercritical fluid cylinder 804 via the inlet 814. Once the supercritical drying chamber 800 is sealed, the compressor can pressurize the drying gas and the heating element can heat up drying gas inside this chamber 800. The operating pressure and the operating temperature for the supercritical drying chamber 800 for this embodiment must be those that are sufficient to bring the drying gas to its supercritical state. For instance, when the drying gas is $CO_2$, the pressure is about 1200 psi or greater and the temperature is about 31° C. or greater. Thus, in this embodiment, the compressor can pressurize the supercritical drying chamber 800 to a pressure of 1200 psi or greater and the heating element can heat the chamber 800 to a temperature of 31° C. or greater.

In a further embodiment, the supercritical fluid may be injected into the supercritical drying chamber 800 into an inlet 815 located near the slit 810 as shown in FIG. 10. The supercritical fluid flow in this example thus flows in a laminar flow which brings the supercritical fluid very close to the wafer 606.

In another embodiment, the supercritical drying chamber 800 couples to a waste container 806. The waste container 806 receives the used supercritical fluid as well as the evaporated liquids that are pushed out or evaporated out of the voids or pores in the wafer 606 by the supercritical fluid. The waste container 806 may include a filter that can clean out contaminants in the supercritical fluid and inject it back into the preparation chamber 802 or the supercritical drying chamber 800 for drying of another wafer.

The supercritical drying chambers described above are adapted to allow accesses from a substrate transferring chamber, such as the substrate transferring chamber 506, for permitting introduction of a substrate from another chamber, such as the wet-cleaning chamber 502. The supercritical drying chambers described above are particularly useful for drying ILD layers that are made out of materials having pores or voids, or as mentioned above, low-k interlayer dielectrics. Examples of low-k interlayer dielectrics include fluorosilicate glass, porous silica, and silk.

Figure 12:
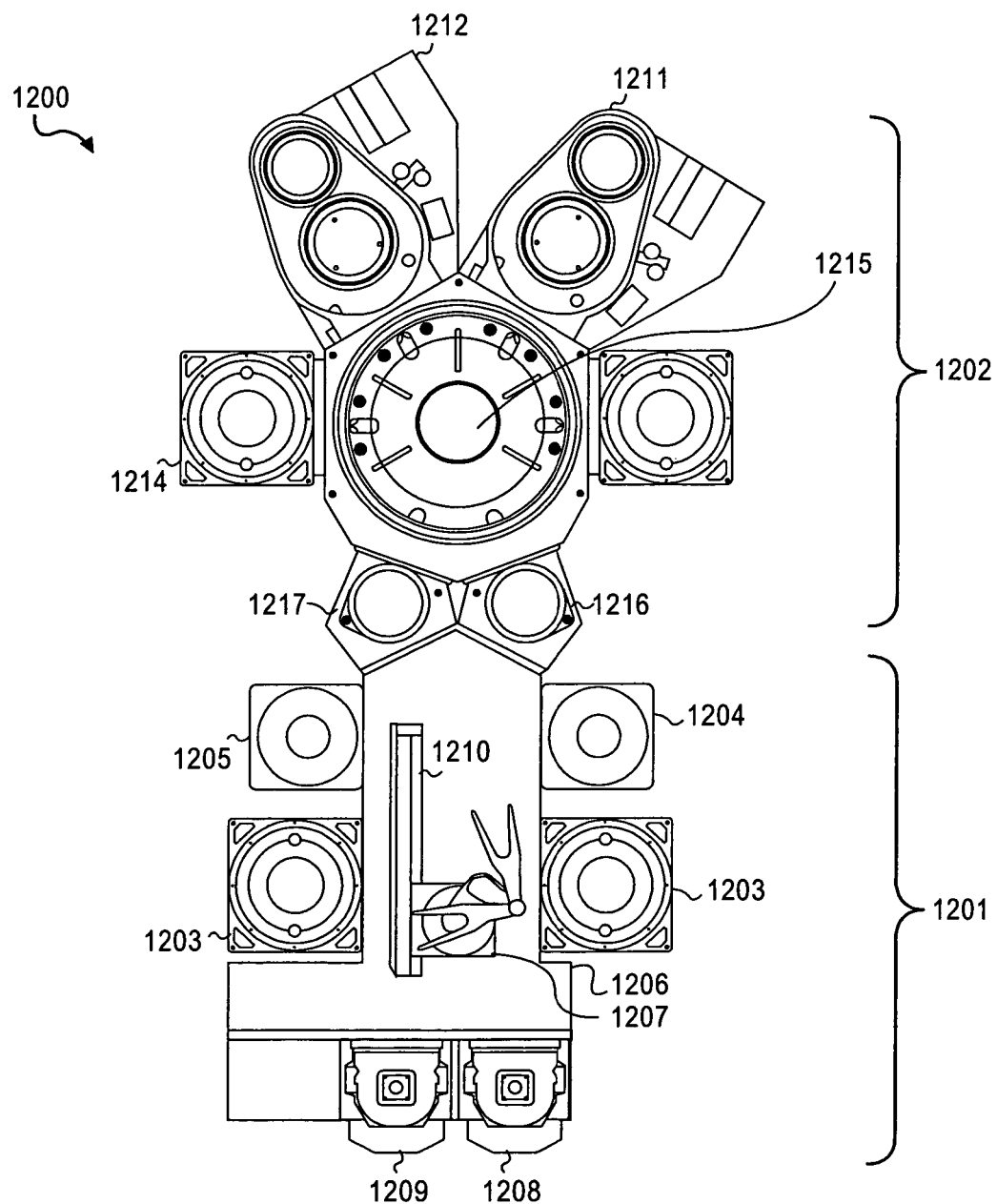
FIG. 12 illustrates an exemplary apparatus that includes a low-pressure chamber which can be used to microscopically dry a substrate in accordance with the present invention.

FIG. 12 illustrates another exemplary embodiment of the present invention. In this embodiment, an apparatus 1200 comprises one or more wet-cleaning chambers 1203, one or more low-pressure chambers 1214, film deposition chambers 1211 and 1212 (e.g., PVD and CVD), an inspection chamber 1205, substrate cassettes 1208 and 1209, load locks 1216 and 1217, and substrate transferring chambers 1215 and 206. As illustrated in this figures, there may be multiple chambers for each type of chamber or just one single chamber for a particular chamber type depending on application. The chambers in the apparatus 1200 are similar to those described in the apparatus 500 shown in FIG. 5.

Additionally, the apparatus 1200 includes the low-pressure chamber 1214. The low-pressure chamber 1214 operates under a low-pressure environment, for example, the operating pressure for the chamber 1214 is less than 10 Torr. The low-pressure chamber 1214 may also operate under a high temperature environment such as running under a temperature ranging from about 100° C. to 200° C. In one example, the low-pressure chamber 1214 is similar to a conventional low-pressure CVD chamber with the exception that no gas inlet is necessary. In another example, the low-pressure chamber 1214 may comprise a pumping device to evacuate the pressure inside the chamber 1214 such that the operating pressure can be less than 10 Torr. The low-pressure chamber 1214 further comprises a heating element in order to heat the chamber to an operating temperature ranging from about 100° C. to 200° C.

In one exemplary embodiment, when a substrate such as the wafer 606 having low-k ILD layers formed thereon is placed in the low-pressure chamber 1214, the substrate can be microscopically dried. When operated under a vacuum condition and a high temperature condition, such as a pressure of about 10 Torr and a temperature ranging from about 100–200° C., the low-pressure chamber 1214 microscopically dries the ILD layers by forcing, removing, and evaporating the liquids trapped in the pores or voids of the ILD layers. The low-pressure chamber 1214 can thus be used for microscopically drying a wafer that has been processed, (e.g., films deposition in the chamber 1211 or 1212), cleaned, and dried (e.g., cleaning and macroscopic drying in the wet-cleaning chamber 1203). Macroscopic drying, as mentioned above, removes the excess residues and/or liquids that are visibly detectable off the substrate and/or the film layers formed thereon. Microscopic drying removes the excess residues and/or liquids that are trapped in the pores or voids present in the substrate or the film layers formed upon the substrate.

It is to be appreciated that the apparatus 1200 may also include (not shown in FIG. 12) the supercritical drying chamber 504 discussed above as desired by application.

In one exemplary embodiment, the substrate transferring chamber 1206 (the first substrate transferring chamber) includes a substrate handling system which may be a robot arm assembly 1207 to handle a substrate such as the wafer 606. The substrate transferring chamber 1206 is coupled to the wet-cleaning chamber 1203, the low-pressure chamber 1214, and the inspection chamber 1205. All of these chambers are horizontally mounted on a first platform 1201. And, the first platform 1201 is placed under a normal atmospheric condition. In this embodiment, the low-pressure chamber 1214 may require a longer amount of time needed to evacuate and to heat up the low-pressure chamber 1214 to bring this chamber down to a pressure of less than 10 Torr and up to a temperature ranging from about 100° C. to 200° C.

The operation of the first platform 1201 is similar to the apparatus 500 discussed above. The cleaning processes of a wafer in the apparatus 1200 proceeds in a sequence timed to optimize the use of available space and the robot arm assembly 1207. One possible sequence has the robot arm assembly 1207 take an unclean wafer from a substrate cassette 1208, install the wafer into a cleaning chamber 1203, remove a clean wafer from another cleaning chamber 1203 and place this clean wafer into the low-pressure chamber 1214, and take a dried wafer from the low-pressure chamber 1214 and place the dried wafer into the substrate cassette 1208.

In another embodiment, the apparatus 1200 further include a second platform 1202 which is adjacent to the first platform 1201. The second platform 1202 houses a second substrate handling chamber, the substrate transferring chamber 1215. The second platform 1202 further includes the load locks 1216 and 1217, the low-pressure chamber 1214, and the film deposition chambers 1211 and 1212. All of these chambers are horizontally mounted to the second platform 1202. The second substrate transferring chamber 1215 is similar to the first substrate handling chamber 1206 in that second substrate transferring chamber 1215 includes a robot arm assembly to handle a substrate such as the wafer 606. The load locks 1216 and 1217 are similar to the substrate cassettes 1208 and 1209 in that they store substrates such as wafers 606. In addition, the load locks 1216 and 1217 enable the transferring of wafers 606 from an atmospheric environment to a sub-atmospheric environment and vise versa.

In one example, the second platform 1202 is placed under a sub-atmospheric condition while the first platform 1201 is placed under a normal atmospheric condition. The wafer 606 can be transferred in and out between chambers, from the first platform 1201 to the second platform 1202, when the wafer 606 needs to be processed under a sub-atmospheric condition for some particular processes and under a normal atmospheric condition for other processes. For instance, the wafer 606 can be transferred between the chambers in the second platform 1202 for film deposition which typically occur under a low-pressure environment. The wafer 606 can then be transferred out of the second platform 1202 and into the first platform 1201 for wet cleaning after the film deposition. The wet cleaning part of the process can take place under a normal atmospheric condition. The wafer 606 can then be further dried in the low-pressure chamber 1214 in the second platform 1202. This arrangement is particularly useful for combining chambers that need to be operated under a low pressure environment (e.g., the film deposition chambers 1211 and 1212, and the low-pressure chamber 1214) with chambers that are operated under a normal atmospheric condition (e.g., the cleaning chamber 1203 and the inspection chamber 1205). One advantage for such arrangement is that it requires less time and energy to adjust the operating pressure and/or the temperature. When the wafer 606 needs to be transferred between the first platform 1201 and the second platform 1202 in which the first platform 1201 is under an atmospheric condition and the second platform 1202 is under a sub-atmospheric condition, the load lock 1216 and 1217 can take the wafer 606 from the atmospheric condition, bring the wafer 606 into a sub-atmospheric condition before allowing the transferring of the wafer 606 into the sub-atmospheric condition. Note that the load lock 1216 and 1217 can also take the wafer 606 from the sub-atmospheric condition into the atmospheric condition if necessary.

In one embodiment, a wafer 606 can be moved in and out of the first platform 1201 and the second platform 1202 in an optimized sequence for processing (e.g., film depositions), cleaning, and drying. One possible sequence of processing a wafer 606 using the apparatus 1200 that includes the first platform 1201 and the second platform 1202 described above can be: (1) the robot assembly 1207 in the first platform 1201 removes a wafer 606 from the cassette 1208 and loads the wafer 606 into the load lock 1216; (2) the robot assembly in the second platform 1202 removes the wafer 606 from the load lock 1216 and loads the wafer 606 into a film deposition chamber (e.g., chamber 1211) for films deposition which could be seen in more details in FIGS. 13A to 13F; (3) the robot assembly in the second platform 1202 removes the wafer 606 having various films formed thereon from the film deposition chamber and loads the wafer 606 into the load lock 1217; (4) the robot assembly 1207 in the first platform 1201 removes the wafer 606 from the load lock 1217 and load the wafer 606 into the cleaning chamber 1203 for cleaning and macroscopic drying; (5) the robot assembly 1207 in the first platform 1201 removes the wafer 606 from the cleaning chamber 1203 and loads the wafer 606 into the load lock 1216; (6) the robot assembly in the second platform 1202 removes the wafer 606 from the load lock 1216 and load this wafer 606 into the low-pressure chamber 1214 for microscopic drying; (7) the robot assembly in the second platform 1202 removes the wafer 606 from the low-pressure chamber 1214 and load the wafer 606 into load lock 1217; and (8) the robot assembly 1207 in the first platform 1201 removes the wafer 606 from the load lock 1217, loads the wafer 606 into the inspection chamber 1205, and transfers the wafer 606 from the inspection chamber 1205 to the cassette 1208. The sequence may be varied in any order to further optimize the processing, cleaning, and drying of the wafer 606.

Figure 13A:
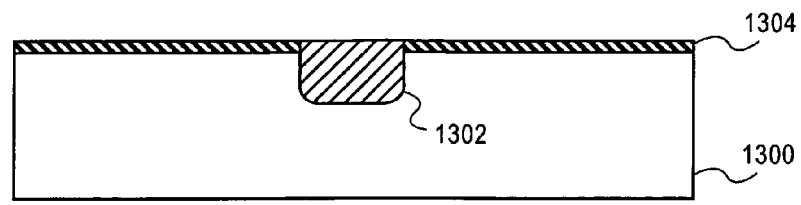
FIGS. 13A to 13F illustrate an exemplary device that includes at least one interlayer dielectric layer that can be made out of a low-k dielectric material which can be microscopically dried using some of the exemplary embodiments of the present invention.
Figure 13B:
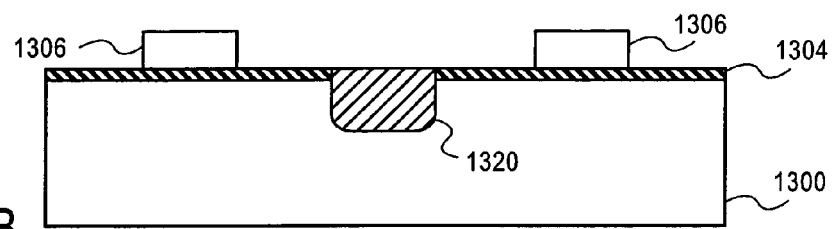
Figure 13C:
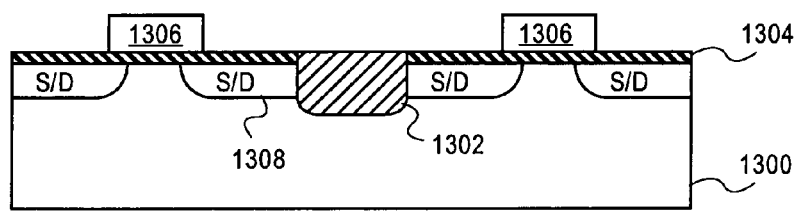

FIG. 13A illustrates a wafer 1300 having a shallow trench isolation (STI) 1302 and a layer of gate oxide 1304. The wafer 1300 can be a substrate upon which a CMOS transistor can be formed. P and N regions may also be defined in the wafer 1300 by methods well known in the art for the NMOS and the PMOS respectively. FIG. 13B illustrates that the wafer 1300 may also include a layer of polysilicon 1306 that has been conformally deposited over the wafer 1300, defined with a gate poly mask (not shown), and etched away to form gate regions or gate conductors. FIG. 13C illustrates that the wafer 1300 may also include source and drain regions 1308 implanted into the active regions of the substrate 1300 to form the N source and drain for an NMOS device or the P source and drain for the PMOS device. Implanting to form the source and drain regions 1308 are well known in the art which is typically achieved by implanting the active regions with arsenic (or phosphorous) for NMOS or boron for PMOS device.

Figure 13D:
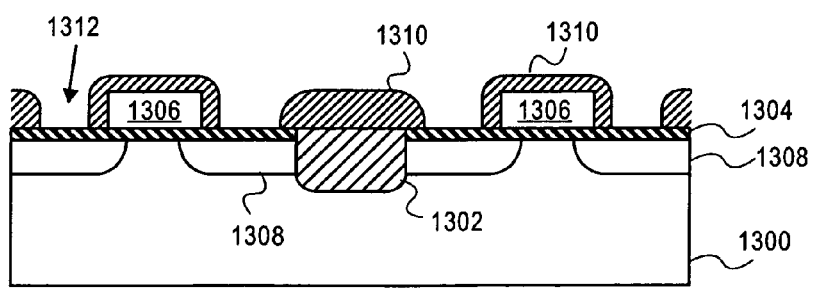
Figure 13E:
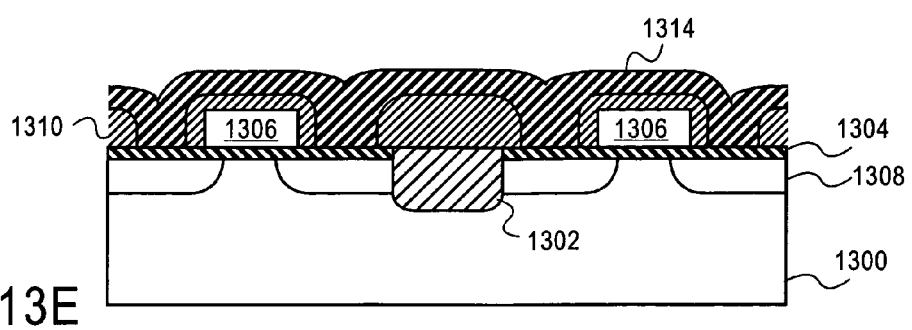
Figure 13F:
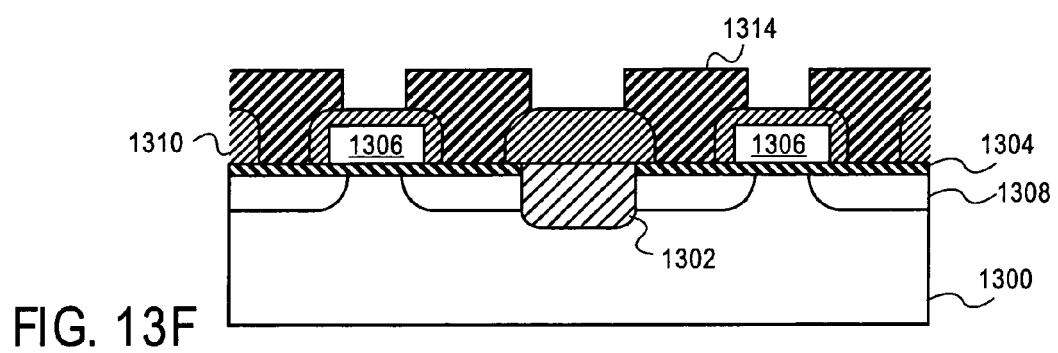

FIG. 13D illustrates that the wafer 1300 may then include a conformal layer of ILD layer 1310 with contact openings (or vias) 1312. The vias 1312 are conventionally formed by wet or dry etching techniques to expose the device to contact areas for necessary metallization layers. FIG. 13E illustrates that the wafer 1300 may include a conductive layer or metallization layer 1314 (e.g., metals such as aluminum, tungsten, or copper) deposited over the surface of the wafer 1300. A patterned mask may be used to pattern the conductive layer 1314 (as shown in FIG. 13F) to form interconnections to sources, drains, and gates in order to connect the device and other circuit components. The metallization layer 1314 is often only a first metallization layer of a device. The metallization layer 1314 is often very thin and is used only for local circuit wiring. Subsequent second, third, and higher levels of metallization are often required. When multiple levels of metallization layer are required, each metallization layer, for example, the metallization layer 1314, is covered with a layer of ILD layer for insulating the first metallization layer from the second metallization layer, and etc. Silicon dioxide ($SiO_2$) has been used in the past, but as mentioned above, a low-k dielectric material such as porous silica or fluorosilicate glass is preferred. In this example, the metallization layer 1314 can be insulated from another metallization by a low-k dielectric material. As mentioned above, the low-k dielectric material has many voids or pores and as such, the exemplary apparatus for microscopic drying discussed above are particularly useful for removing residual liquids trapped in those pores or voids. The cleaning, the macroscopic drying, and the microscopic drying of the wafer 1300 can occur between depositions of each new metallization to ensure that the low-k dielectric material used to insulate one metallization layer from another does not contain any trapped liquids or contaminants.

FIGS. 14 to 18 illustrate exemplary methods for cleaning a substrate such as a wafer 606. In one example, the wafer 606 has films deposited thereon. The films may be metallization that are used in making electronic devices such as transistors, and capacitors. The films may also be an insulation layer that is deposited between two metallization layers. In a preferred embodiment, the film is a low-k dielectric material having pores and voids. Conventional cleaning and drying apparatuses and methods do not sufficiently remove the residues and/or the liquids that are often trapped in these pores and voids present in the low-k dielectric material. The uses of the apparatus 500 and apparatus 1200 described above according to the methods below remove the residues and/or the liquids that are trapped in these pores and voids. The methods below can be repeated as often as necessary during the forming of many different films that may be many insulation layers formed therebetween.

Figure 14:
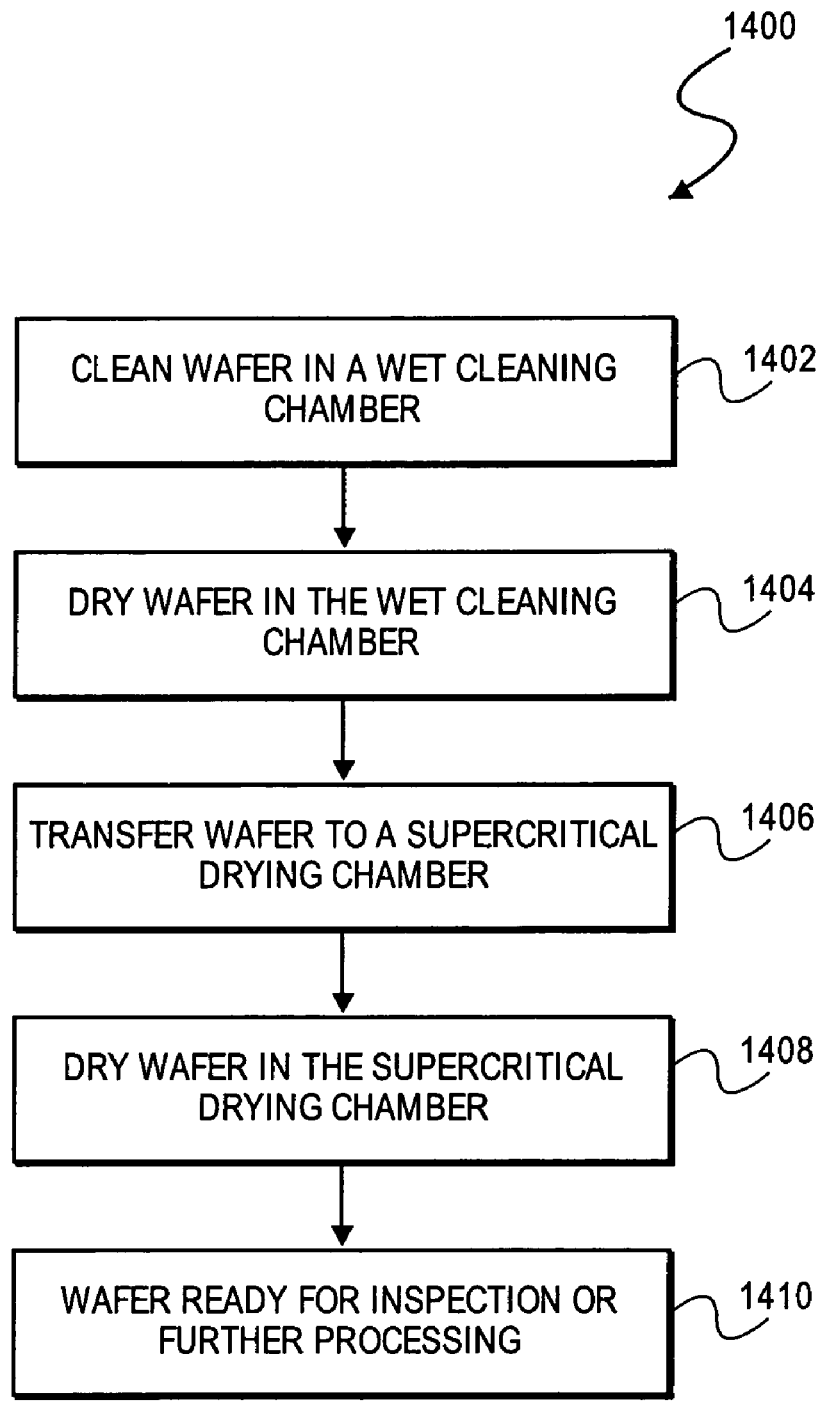
FIG. 14 illustrates an exemplary process of cleaning a substrate using an exemplary apparatus of the present invention.

FIG. 14 illustrates an exemplary method 1400 of cleaning the wafer 606. At box 1402, the wafer is cleaned in a wet-cleaning chamber such as the cleaning chamber 502 discussed above. At box 1404, the wafer is macroscopically dried in the wet-cleaning chamber 502. At box 1406, the wafer is transferred from the wet-cleaning chamber 502 to a supercritical drying chamber such as the supercritical drying chamber 1400 discussed above. At box 1408, the wafer is microscopically dried in the supercritical drying chamber 1400. At box 1410, the wafer is ready for inspection or further processing, for example, deposition of a film.

Figure 15:
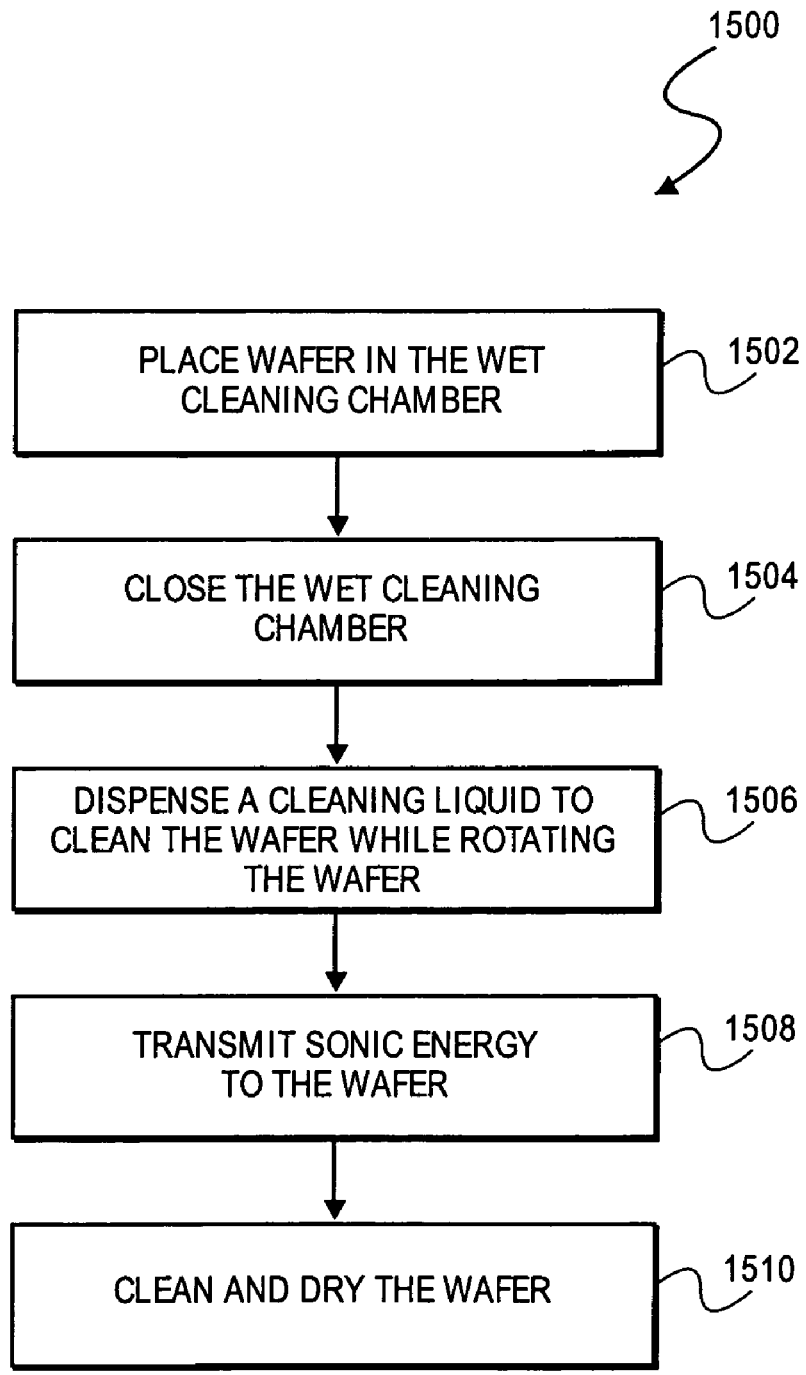
FIG. 15 illustrates an exemplary process of cleaning and drying a substrate in an exemplary wet-cleaning chamber.

FIG. 15 illustrates an exemplary method 1500 of cleaning the substrate in the wet-cleaning chamber 502. At box 1502, the wafer is placed in the wet-cleaning chamber 502. At box 1504, the wet-cleaning chamber is sealed. At box 1506, a cleaning liquid is dispensed into the wet-cleaning chamber 502 to clean the wafer 606 while the wafer 606 is being horizontally rotated (or spun). At box 1508, a transducer is used to transmit sonic energy (e.g., megasonic waves) to the wafer. In one example, the sonic energy is transmitted through the cleaning liquid. In another example, the liquid is only dispensed to the bottom side of the wafer, which is the non-device side of the wafer. The spinning with the sonic energy actions remove the residues on the top side of the wafer 606 without interfering with the top side of the wafer 606, which typically comprises a plurality of electronic devices formed thereon. In yet another example, an insert gas such as nitrogen is dispensed on the top side of the wafer to prevent the cleaning liquid from getting to the top side of the wafer 606. In another example, a second source of liquid can be dispensed onto the top side of the wafer 606 if necessary. At box 1510, the wafer 606 is macroscopically dried in the wet-cleaning chamber 502. The macroscopic drying can be accomplished by blowing nitrogen while spinning or rotating the wafer 606. The macroscopic drying removes all of the visible residues and or fluids on the wafer 606 but may leave residues or liquids in the voids and pores in the wafer 606 and/or in the film layers formed upon the wafer 606.

Figure 16:
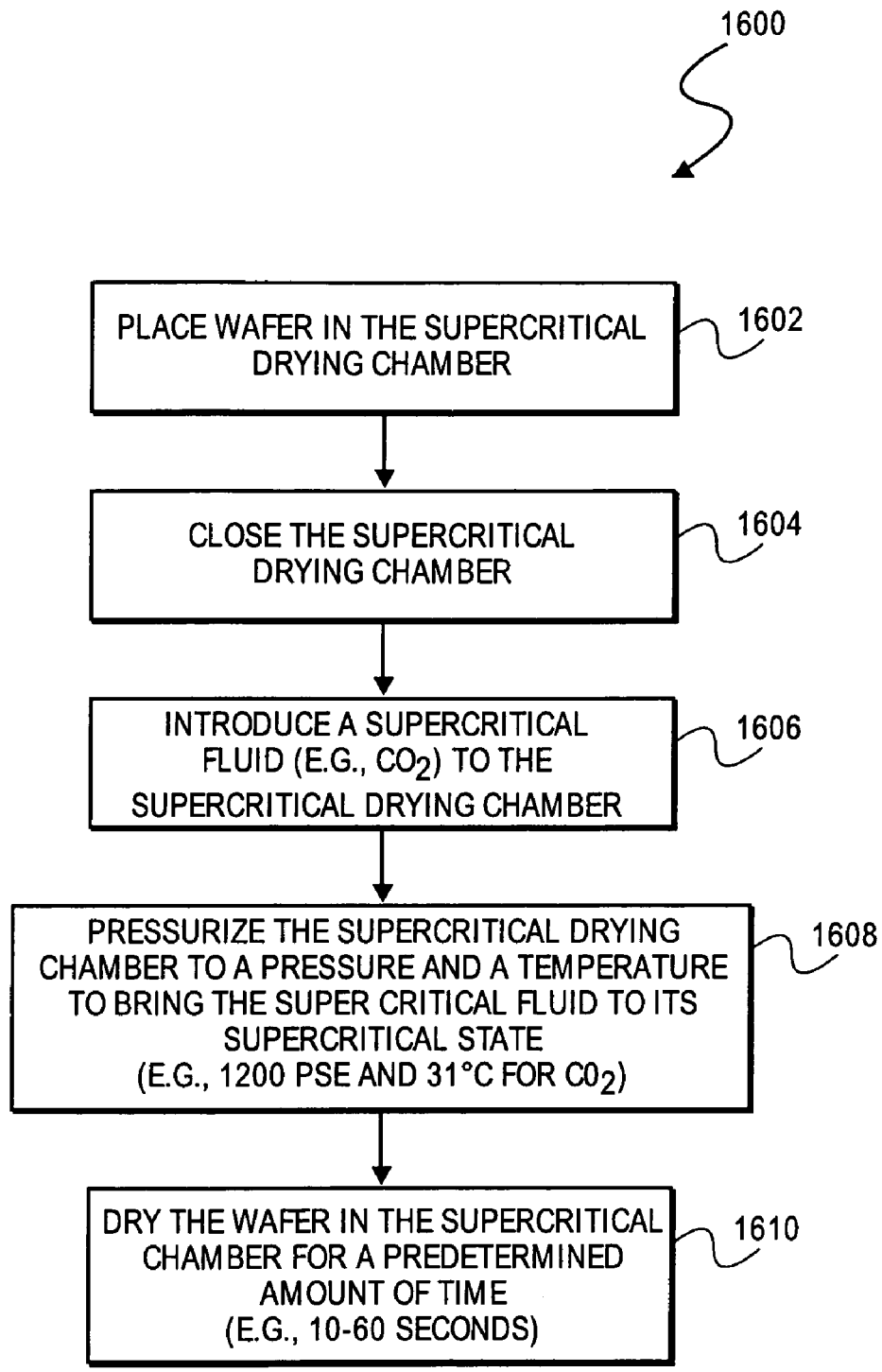
FIG. 16 illustrates an exemplary process of drying a substrate using a supercritical fluid in a supercritical drying chamber of the present invention.

FIG. 16 illustrates an exemplary method 1600 of drying the wafer 606 in the supercritical drying chamber 800. At box 1602, the wafer 606 is placed in the supercritical drying chamber 800. At box 1604, the supercritical drying chamber 800 is sealed. At box 1606, a cleaning fluid that can be transitioned into a supercritical fluid under appropriate condition (discussed above) for example, $CO_2$, is introduced into the supercritical drying chamber 800 via an inlet. At box 1608, the supercritical drying chamber 800 is pressurized and heated to bring the drying gas to its supercritical state. In the example where the drying gas is $CO_2$, the pressure is brought up at least 1200 psi and the chamber is heated up to 31° C. At box 1610, the wafer 606 is dried when the supercritical fluid in its supercritical state quickly penetrates the pores and voids in the wafer 606 and/or the film layers to dissolve any residues and evaporates any liquids trapped in these pores and voids. The residues and the liquids are removed from these voids and pores and evaporate through an outlet. The wafer 606 is dried for about 16 to 60 seconds. The chamber pressure can be reduced before the wafer 606 the removed from the chamber 800.

Figure 17:
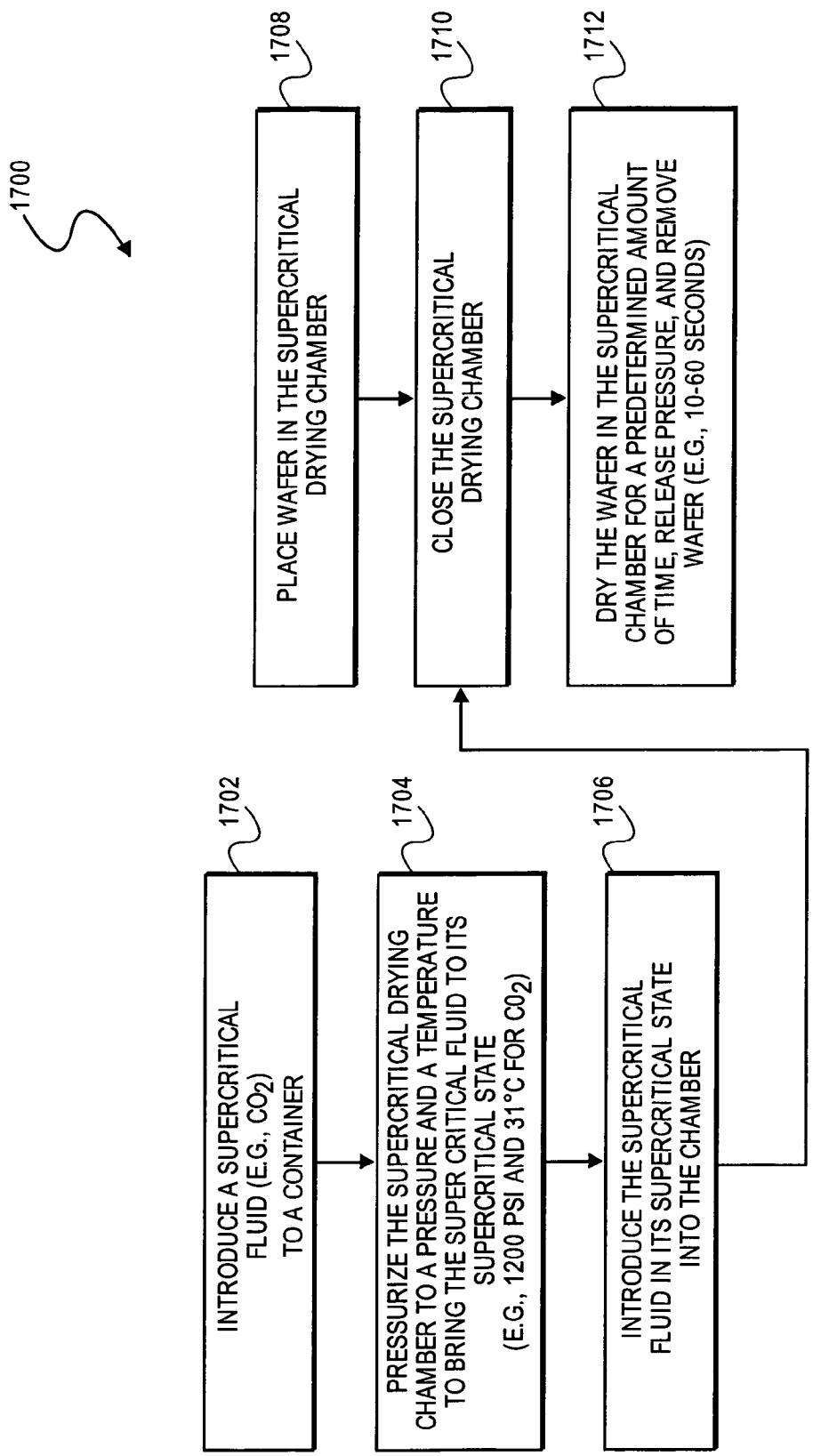
FIG. 17 illustrates another exemplary process of drying a substrate using a supercritical fluid in a supercritical drying chamber of the present invention.

FIG. 17 illustrates another exemplary method 1700 of drying the wafer 606 in the supercritical drying chamber 800. At box 1702, the drying gas is injected into a preparation chamber. In one example, the drying gas is $CO_2$. At box 1704, the drying gas is pressurized and heated in the preparation chamber such that it is brought to its supercritical state. When the cleaning as is $CO_2$, $CO_2$ is pressurized at least 1200 psi and heated up to at least 31° C. in the preparation chamber. At box 1706, the drying gas in its supercritical state is introduced into the supercritical drying chamber 800. At box 1708, the wafer 606 is placed in the supercritical drying chamber 800. Placing the wafer 606 into the supercritical drying chamber 800 can happen anytime prior to the dispensing of the drying gas (in its supercritical state) into the supercritical drying chamber 800. At box 1710, the supercritical drying chamber 800 is sealed. At box 1712, the wafer 606 is dried when the supercritical fluid in its supercritical state quickly penetrates the pores and voids in the wafer 606 and/or the film layers to dissolve any residues and evaporates any liquids trapped in these pores and voids. The residues and the liquids are removed from these voids and pores and evaporate. The wafer 606 is dried for about 10 to 60 seconds.

Figure 18:
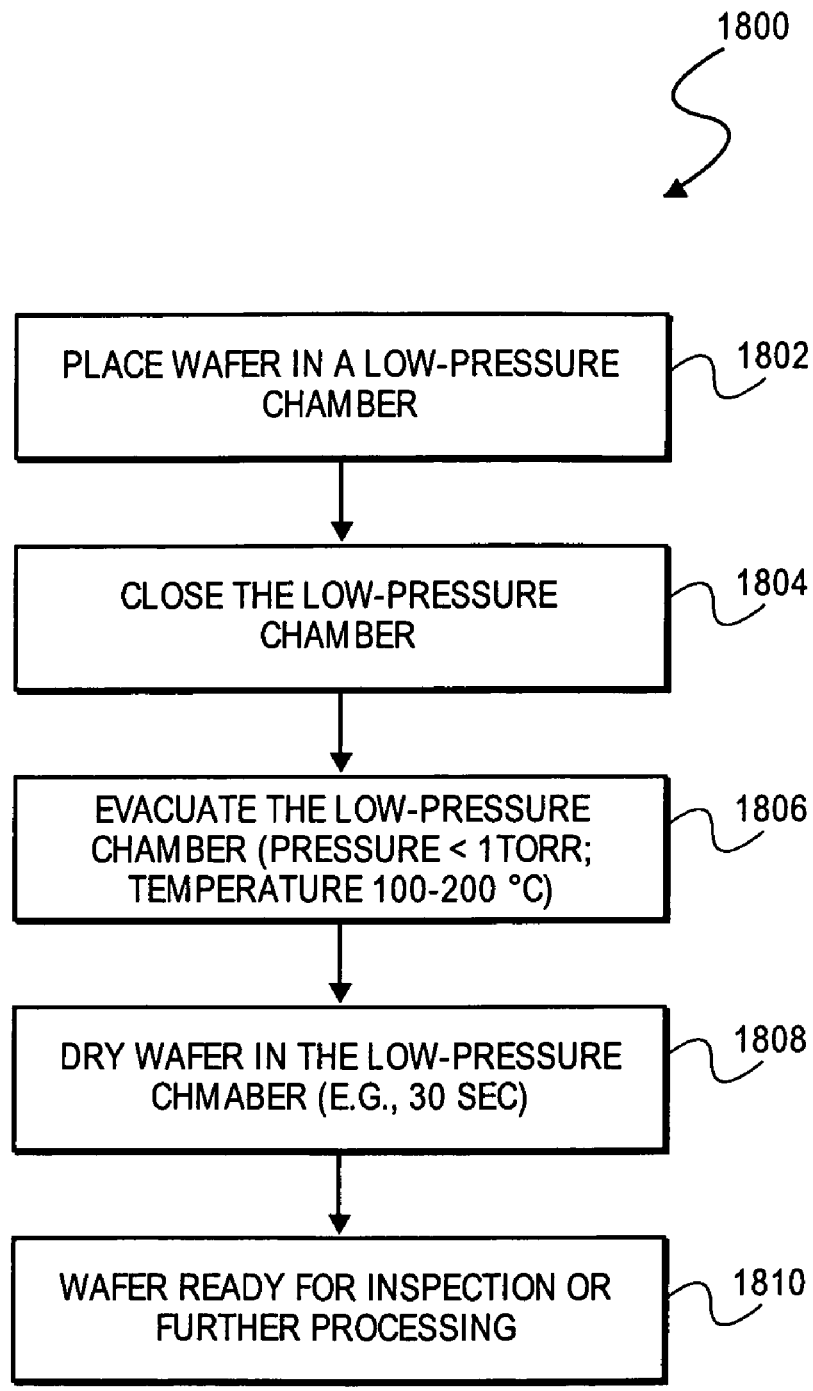
FIG. 18 illustrates an exemplary process of drying a substrate in a low-pressure chamber according to the present invention.

FIG. 18 illustrates an exemplary method 1800 of cleaning and drying the wafer 606 using a low-pressure chamber such as the low-pressure chamber 1214 described in the apparatus 1800 above. At box 1802, the wafer 606 is placed in the low-pressure chamber 1214. At box 1804, the chamber 1214 is closed. At box 1806, the chamber 1814 is evacuated to a pressure lower than 10 Torr and the chamber 1214 is heated up to a temperature ranging from about 100° C. to 200° C. At box 1808, the wafer 606 is dried for about 30 seconds. The drying time may be longer or shorter depending on the particular wafer, the thickness of the film, or the density of the pores or voids inside the film that is formed upon the wafer 606. A preferred time of drying ranges from 10 seconds to 180 seconds. At box 1810, the wafer 606 is dried and is ready for inspection or other processing, for example, film deposition.

It should be appreciated that the methods described in FIGS. 14 to 18 can be used for a wafer processing at any state. For instance, the wet cleaning, macroscopic drying, and microscopic crying can occur between the various film depositions to ensure that a particular film is completely cleaned and dried before the next film can be deposited.

We claim:

1. An apparatus comprising:
   a wet-cleaning chamber;
   a supercritical drying chamber; and
   a substrate transferring chamber transferring a substrate to and from the wet-cleaning chamber and the supercritical drying chamber; wherein the wet-cleaning chamber and the supercritical drying chamber are coupled to the substrate transferring chamber;
   wherein the supercritical drying chamber includes a slit of a height to allow for the substrate to be transferred in and out from the transferring chamber, and a slit valve to seal the supercritical drying chamber.

2. An apparatus as in claim 1 wherein the wet-cleaning chamber is a single-wafer cleaning chamber.

3. An apparatus as in claim 1 wherein the wet-cleaning chamber is a megasonic wet-cleaning chamber.

4. An apparatus as in claim 1 wherein the wet-cleaning chamber is a horizontal spinning chamber.

5. An apparatus as in claim 1 wherein the wet-cleaning chamber is a horizontal spinning chamber having sonic waves sent to a fluid that cleans the substrate.

6. An apparatus as in claim 1 further comprising an inspection chamber.

7. An apparatus as in claim 1 wherein the supercritical drying chamber is coupled to a preparation chamber which delivers a drying gas to the supercritical drying chamber, and which causes the drying gas to transition into a supercritical fluid.

8. An apparatus as in claim 7 wherein the preparation chamber is coupled to a compressor and a heating element.

9. An apparatus as in claim 1 further comprising a waste container coupling to the supercritical drying chamber.

10. An apparatus as in claim 9 further comprising:
    a filter coupling to the waste container; and
    a preparation chamber coupling to the supercritical drying chamber.

11. An apparatus as in claim 1 wherein the supercritical drying chamber further couples to a compressor and a heating element.

12. An apparatus as in claim 1 wherein the substrate transferring chamber includes a robot which handles the substrate.

13. An apparatus as in claim 1 wherein the wet-cleaning chamber and the supercritical drying chamber are mounted on a horizontal platform which houses the substrate handing chamber.

14. An apparatus as in claim 13 wherein the horizontal platform further comprises a film deposition chamber.

15. An apparatus as in claim 14 wherein the film deposition chamber is one of a chemical vapor deposition chamber and a physical deposition chamber.

16. An apparatus comprising;
    a wet-cleaning chamber;
    a single-wafer drying chamber for microscopically drying a porous film having residual liquids left in said porous film after said porous film is macroscopically dried in said wet-cleaning chamber; and
    a substrate transferring chamber transferring a substrate having the porous film deposited thereon to and from the wet-cleaning chamber and the single wafer drying chamber; wherein the wet-cleaning chamber and the single-wafer drying chamber are coupled to the substrate transferring chamber;
    wherein the single-wafer drying chamber includes a slit of a height to allow for the substrate to be transferred in and out from the transferring chamber, and a slit valve to seal the single-wafer drying chamber.

17. An apparatus as in claim 16 wherein the single-wafer drying chamber is a supercritical drying chamber.

18. An apparatus as in claim 16 wherein the single-wafer drying chamber is a low-pressure chamber.

19. A apparatus comprising:
    a wet-cleaning chamber;
    a low-pressure chamber; and
    a substrate transferring chamber transferring a substrate to and from the wet-cleaning chamber and the low-pressure chamber: wherein the wet-cleaning chamber and the low-pressures chamber are coupled to the substrate transferring chamber;
    wherein the low-pressure chamber includes a sealable slit of a height sufficient for the substrate to be transferred in and out therefrom;
    wherein the low-pressure chamber includes a substrate supporter coupled to a hydraulic mechanism to raise and lower the substrate supporter, and wherein lowering the substrate supporter opens the slit and raising the substrate supporter seals the slit.

20. An apparatus as in claim 19 wherein the wet-cleaning chamber is a single-wafer cleaning chamber.

21. An apparatus as in claim 19 wherein the wet-cleaning chamber is a megasonic wet-cleaning chamber.

22. An apparatus as in claim 19 wherein the wet-cleaning chamber is a horizontal spinning chamber.

23. An apparatus as in claim 19 wherein the wet-cleaning chamber is a horizontal spinning chamber having sonic waves sent to a non-device side of the substrate.

24. An apparatus as in claim 19 further comprising an inspection chamber.

25. An apparatus as in claim 19 wherein the low-pressure chamber has a pressure lower than 10 Torr.

26. An apparatus as in claim 19 wherein the substrate transferring chamber includes a robot which handles the substrate.

27. An apparatus as in claim 19 wherein the wet-cleaning chamber and the low-pressure chamber are mounted on a horizontal platform which houses the substrate transferring chamber.

28. An apparatus as in claim 27 wherein the horizontal platform further comprises a film deposition chamber.

29. An apparatus as in claim 28 wherein the film deposition chamber is one of a chemical vapor deposition chamber and a physical deposition chamber.

30. An apparatus as in claim 19 wherein a substrate in the low pressure chamber is heated up to a temperature ranging from about 100° C. to 200° C.

* * * * *